United States Patent
Scudiere et al.

(10) Patent No.: US 6,444,917 B1
(45) Date of Patent: Sep. 3, 2002

(54) ENCAPSULATED CERAMIC SUPERCONDUCTORS

(75) Inventors: John D. Scudiere, Bolton; David M. Buczek, Dover; Steven Fleshler, Brookline; Derek Patrick Daly, Sharon; Richard E. Harnois, Wrentham, all of MA (US); Stephen R. Norman, Hampshire (GB); Paola Caracino, Milan (IT); Marco Nassi, Torino (IT); Sergio Spreafico, Albavilla (IT)

(73) Assignees: American Superconductor Corporation, Westborough, MA (US); Pirelli Cavi e Sistemi S.p.A., Milano (IT)

( * ) Notice: Subject to any disclaimer, the term of this patent is extended or adjusted under 35 U.S.C. 154(b) by 0 days.

(21) Appl. No.: 09/360,318

(22) Filed: Jul. 23, 1999

(51) Int. Cl.$^7$ ................................................ H01B 12/00

(52) U.S. Cl. ...................... 174/125.1; 505/885; 505/237

(58) Field of Search .................... 174/125.1; 505/231, 505/230, 237, 239, 704, 886, 887, 885

(56) References Cited

U.S. PATENT DOCUMENTS

| | | | |
|---|---|---|---|
| 3,537,827 A | 11/1970 | Benz et al. | |
| 4,617,789 A | 10/1986 | Borden | |
| 4,647,888 A | 3/1987 | Woolf et al. | 335/216 |
| 4,970,197 A | 11/1990 | Shiota et al. | |
| 4,970,483 A | 11/1990 | Wicker et al. | |
| 4,973,574 A | 11/1990 | Nishio et al. | |
| 4,975,416 A | 12/1990 | Onishi et al. | |
| 4,990,490 A | 2/1991 | Pathare et al. | |
| 4,994,435 A | 2/1991 | Shiga et al. | |

(List continued on next page.)

FOREIGN PATENT DOCUMENTS

| | | |
|---|---|---|
| EP | 0 434 397 A1 | 6/1991 |
| EP | 0837512 | 4/1998 |
| JP | 01110799 | 4/1989 |
| JP | 01153507 | 6/1989 |
| JP | 02 050 403 | 2/1990 |
| JP | 03-110806 | 5/1991 |
| JP | 06 162 835 | 6/1994 |
| JP | 6 309955 A | 11/1994 |
| WO | WO98/09004 | 3/1998 |
| WO | WO98/09295 | 3/1998 |
| WO | WO98/09296 | 3/1998 |
| WO | WO99/19707 | 4/1999 |

OTHER PUBLICATIONS

USSN 08/731,302, filed Oct. 15, 1996, entitled "Improved Performance of Oxide Dispersion Strengthened Superconductor Composites".

USSN 08/943,047, filed Oct. 1, 1997 and entitled "Substrates With Improved Oxidation Resistance".

S.X. Dou et al., "Effect of Silver on Phase Formation and Superconducting Properties of Bi–2223/Ag Tapes," vol. 5, No. 2, pp. 1830–1833, Jun., 1995, University of Wollongong, Wollongong, Australia.

*Primary Examiner*—Kamand Cuneo
(74) *Attorney, Agent, or Firm*—Fish & Richardson, P.C.

(57) ABSTRACT

The invention features a superconducting conductor for use in a preselected fluid cryogen including a composite ceramic superconducting wire having an outer surface along its length; and a sealing structure hermetically surrounding the outer surface to prevent the cryogen from infiltrating into the wire and degrading its superconducting properties, even under pressurized conditions. The superconducting conductor can be used in superconducting cabling and coil applications. The sealing structure can be formed by laminating metallic tapes to the wire, encircling at least one metallic sheet around the outer surface of the wire, welding a plurality of metallic sheets to one another to encircle the outer surface of the wire, or forming a polymer coating completely covering the outer surface of the wire.

28 Claims, 8 Drawing Sheets

U.S. PATENT DOCUMENTS

| | | |
|---|---|---|
| 4,994,633 A | 2/1991 | Puh |
| 5,059,582 A | 10/1991 | Chung |
| 5,104,849 A | 4/1992 | Shiga et al. |
| 5,114,908 A | 5/1992 | Sato et al. .................. 505/231 |
| 5,116,809 A | 5/1992 | Tsuno et al. |
| 5,121,869 A | 6/1992 | Knudsen et al. |
| 5,132,283 A * | 7/1992 | McCune |
| 5,140,004 A | 8/1992 | Tanaka et al. |
| 5,151,406 A | 9/1992 | Sawada et al. |
| 5,169,831 A * | 12/1992 | Yamamoto et al. |
| 5,196,399 A | 3/1993 | Shiota et al. |
| 5,200,390 A | 4/1993 | Howng |
| 5,200,391 A | 4/1993 | Fisher et al. |
| 5,232,908 A | 8/1993 | Shiga et al. |
| 5,248,657 A * | 9/1993 | Bailey et al. |
| 5,252,550 A | 10/1993 | Yamauchi et al. |
| 5,276,281 A | 1/1994 | Sato et al. .................. 505/231 |
| 5,299,728 A | 4/1994 | King et al. |
| 5,312,802 A | 5/1994 | Hayashi et al. |
| 5,372,991 A | 12/1994 | Hayashi et al. |
| 5,379,020 A | 1/1995 | Meier et al. |
| 5,399,547 A | 3/1995 | Negm et al. |
| 5,531,015 A | 7/1996 | Manlief et al. |
| 5,545,932 A * | 8/1996 | Estop et al. |
| 5,620,798 A * | 4/1997 | Huang et al. |
| 5,637,260 A | 6/1997 | Okuda et al. ................ 252/506 |
| 5,801,124 A | 9/1998 | Gamble et al. |
| 5,987,342 A * | 11/1999 | Scudiere et al. |
| 6,110,606 A * | 8/2000 | Scudiere et al. |

* cited by examiner

FIG. 9

ENCAPSULATED CERAMIC SUPERCONDUCTORS

BACKGROUND OF THE INVENTION

The invention relates to composite ceramic superconducting tapes and structures. Tapes including ceramics such as $YBa_2Cu_3O_{7-\delta}$ (YBCO 123), $(Pb,Bi)_2Sr_2Ca_2Cu_3O$ (BSCCO 2223), and $(Pb,Bi)_2Sr_2Ca_1Cu_2O$ (BSCCO 2212) can become superconducting at relatively high temperatures, e.g., liquid nitrogen temperatures, and are ideal for carrying electrical current over large distances. The composite superconducting tape usually includes superconducting portions of ceramic material within a conductive metal matrix (e.g., BSCCO filaments within a noble metal matrix) or superconducting portions coated on a conductor (e.g., one or more layers of YBCO or BSCCO supported on a conducting substrate). A support structure such as a metallic tape can be laminated to the composite superconducting tape to provide it with mechanical strength and resilience. During operation the superconducting article (e.g., superconducting tape and support structure) is immersed in fluid cryogen (e.g., liquid nitrogen, liquid helium, or supercritical helium) for an extended period of time. During this time fluid cryogen may infiltrate into the superconducting ceramic material. For example, the infiltration may occur when a portion of the ceramic material, which can be porous, is directly exposed to the cryogen, or when one or more surface defects in the composite material provide a channel between the cryogen and the ceramic material.

Such infiltration can be a serious problem because upon warming the article, the cryogen can quickly vaporize, causing pressure to build up within the article. For example, the density of liquid nitrogen at 77 K is seven hundred times greater than that of nitrogen gas at ambient conditions. The pressure build up within the article can create a large physical defect in the superconducting ceramic and significantly degrade its superconducting properties (e.g., transport properties), thus blocking the desired electrical performance of the article. Because the defect introduces the appearance of a bulge or balloon on the exterior of the superconducting article, this problem is referred to as the "balloon" problem.

SUMMARY OF THE INVENTION

Applicants have discovered that even where composite ceramic superconducting tapes have a metal coating applied to their surface, cryogen may still infiltrate into the ceramic material through porous or microporous defects in the coating and form balloons. Such defects can be difficult to locate prior to balloon formation because they can be exceedingly small and rare along the length of the tape. Thus, a coated tape vulnerable to balloon formation may, to the eye, look perfect prior to cryogenic thermal cycling. Moreover, the likelihood of cryogen infiltration through such defects increases when the fluid cryogen is under pressurized conditions, e.g., up to about 1 to 33 bars, and when the superconducting article is exposed to the fluid cryogen for long periods of time, e.g., several weeks, several years, or many years. Such conditions are typical for superconductive cabling applications.

Applicants have recognized that a surface defect in the composite ceramic superconducting tape can cause an overlapping defect in an applied metal coating. For example, a surface defect may prevent solder from wetting over the defect, thereby causing a microporous defect to form in an applied solder coating. The overlapping defects can provide a channel through which cryogen can infiltrate into the ceramic material. In tapes formed of BSSCO filaments in a noble metal matrix, for example, such surface defects can result from oxides released from the BSSCO powder during the powder-in-tube fabrication of the composite ceramic tape.

More generally, defects in the composite ceramic tape and metal coating can result during handling and applications manufacturing. Microporous defects in the metal coating can also be caused by shrinkage voids during cooling of the metal coating when the corresponding dimensions of the metal coating are too large (e.g., larger than 0.080"). Statistically, some defects in the composite ceramic tape may overlap with defects in the metal coating to form one or more channels through which cryogen can infiltrate into the ceramic material.

Embodiments of the present invention substantially prevent such cryogen infiltration by completely encapsulating the superconducting tape along its length within a sealing structure. The sealing structure hermetically seals the entire surface along the length of the superconducting tape (e.g., the top, bottom, and sides of the tape) from the cryogen bath to prevent cryogen infiltration. For example, in one embodiment, a first stainless steel tape is laminated to the top of the composite ceramic tape and a second stainless steel tape is laminated to the bottom of the composite ceramic tape to sandwich the composite ceramic tape. The stainless steel tapes are selected to be wider than the composite ceramic tape so that they overhang the sides of the composite ceramic tape. Solder fillets can then seal the sides of the ceramic tape because the solder can wet to the overhanging portions of the metallic tapes and form a continuous surface covering the sides of the composite ceramic tape. The combination of the metallic tapes and the solder fillets thus forms the sealing structure.

The sealing structure can generally provide mechanical reinforcement to the composite ceramic tape, e.g., by including one or more metallic laminates. Alternatively, the sealing structure can be separate from such support structure, e.g., it can encapsulate a ceramic tape already having one or more metallic laminates bonded thereto for providing mechanical reinforcement.

In general, in one aspect, the invention features a superconducting ceramic conductor for use in a preselected fluid cryogen including: a composite ceramic superconducting wire having an outer surface along its length; and a sealing structure hermetically surrounding the outer surface to prevent the cryogen from infiltrating into the wire and degrading its superconducting properties.

The superconductor can include any of the following features. The wire and surrounding sealing structure can be greater than 50 meters long. The wire can include a metallic matrix supporting a plurality of superconducting ceramic filaments. Alternatively, the wire can include at least one superconducting ceramic layer and at least one metallic substrate supporting the at least one superconducting ceramic layer. The sealing structure can be metallic. The sealing structure can prevent the cryogen from infiltrating into the wire through the outer surface under pressurized conditions, for example, the pressurized conditions can exceed about 10 atm and the fluid cryogen can be liquid nitrogen.

Furthermore, the wire can be a composite ceramic superconducting tape having a top face, a bottom face, and side faces, and wherein the outer surface is the top, bottom, and side faces. For example, the sealing structure can include: a first metallic tape laminated to the top face of the composite tape; a second metallic tape laminated to the bottom face of the composite tape, the first and second metallic tapes extending beyond the side faces of the composite tape; and non-porous solder fillets adjacent the side faces of the composite tape filling space between the metallic tapes. The metallic tapes can include stainless steel, Cu—Be alloy, aluminum, copper, nickel, or Cu—Ni alloy. The first and second metallic tapes can be at least 5% wider than the composite tape to extend beyond the side faces of the composite tape. The composite tape and the sealing structure can define an aspect ratio for the conductor that is greater than about five. Alternatively, the sealing structure can include: a first metallic tape laminated to the top face of the composite tape and having portions extending beyond the side faces of the composite tape; and a second metallic tape laminated to the bottom face of the composite tape and having portions extending beyond the side faces of the composite tape, wherein adjacent each side face the extended portion of the first metallic tape is welded to the extended portion of the second metallic tape.

In other embodiments, the sealing structure can include a ductile metallic sheet encircling the outer surface of the wire, wherein regions on opposite sides of the metallic sheet are welded to one another. Alternatively, the sealing structure can be a cured polymer layer encircling the outside surface of the wire. In either case, the conductor can further include a metallic tape laminated to the wire for mechanical reinforcement with the ductile metallic sheet or cured polymer layer encircling the wire and the metallic tape. The cured polymer layer can include conductive media, e.g., metallic elements dispersed within the polymer layer. Where the wire has a substantially rectangular cross section, the conductive media can permit the polymer layer to be conductive at least along a direction parallel to the thickness of the wire.

In another aspect, the inventions features a superconducting cable including the superconducting ceramic conductor described above.

In a further aspect, the invention features a superconducting coil including the superconducting ceramic conductor described above.

In a further aspect, the invention features a cryogenically cooled assembly including: a vessel for containing a fluid cryogen; a fluid cryogen; and a superconducting article at least partially immersed in the fluid cryogen, the article including the superconducting ceramic conductor described above in direct contact with the fluid cryogen. In some embodiments, the assembly can further include a refrigeration unit for cooling the fluid cryogen and a circulating pump for passing cryogen through the refrigeration unit. During operation, the circulating pump can cause the pressure of the cryogen fluid in the vessel to exceed 1 atm or even exceed 10 atm.

In general, in another aspect, the invention features a superconducting conductor for use in a preselected fluid cryogen. The conductor includes: a composite superconducting wire having an outer surface surrounding the wire along its length, and a sealing structure hermetically surrounding the outer surface to permit the superconducting ceramic conductor to withstand thermal cycling in which the fluid cryogen is under pressurized conditions without degrading the current carrying capability of the superconducting ceramic tape by more than 10%. For example, the pressurized conditions can exceed about 2 bar (e.g., in the range of about 10 to 33 bar) and the fluid cryogen can be liquid nitrogen.

In general, in another aspect, the invention features a method of making a superconducting conductor for use in a preselected fluid cryogen. The method includes: providing a composite ceramic superconducting wire having an outer surface along its length; and hermetically surrounding the outer surface with a sealing structure to prevent the cryogen from infiltrating into the wire and degrading its superconducting properties.

Embodiments of the method can include any of the following features. The provided wire can be formed by at least one sequence of a mechanical deformation and a subsequent heat treatment of a container including superconducting ceramic precursor. The hermetically surrounding step can include laminating metallic tapes to the wire, encircling at least one metallic sheet around the outer surface of the wire, welding a plurality of metallic sheets to one another to encircle the outer surface of the wire, or forming a polymer coating completely covering the outer surface of the wire. In the latter embodiment, the method can further include adding conductive media to the polymer coating prior to covering the outer surface of the wire.

As used herein, a composite ceramic superconducting wire includes a metallic matrix supporting superconducting ceramic portions, or one or more metallic substrates supporting superconducting ceramic portions. The composite superconducting wire can have an arbitrary cross sectional profile, e.g., a circular, elliptical, or substantially rectangular profile. For example, the composite ceramic superconducting wire can be a composite ceramic superconducting tape.

For the purpose of the present invention, a superconducting wire or tape is meant to describe an elongate composite element capable of carrying current under superconducting conditions, which, after being in contact with cryogenic fluid at superconducting temperatures for a predetermined period of time and subsequently heated to a higher temperature (e.g., room temperature), can show degradation. Such degradation is typically associated with the presence or formation of one or more balloons and/or includes a reduction of the superconducting properties, such as a reduction of the transport critical current.

By way of example, a tape or wire made through a thermo-mechanical process may include a metallic layer on its outer surface, with superconducting ceramic portions formed on the inside. The thermo-mechanical process is capable of causing or facilitating the formation of defects that result in cryogen infiltration and subsequent degradation of the tape or wire.

In another example, a tape or wire includes a layer of superconducting ceramic material applied over a substrate and a surrounding protection layer, typically applied by a sputtering or vaccuum deposition technique. The protection layer, even if effective to protect the superconducting ceramic material from chemical contact with the external atmosphere, has a thickness and strength not sufficient to prevent the cryogenic fluid penetration and the subsequent degradation it causes, particularly when exposed to the cryogenic fluid for a long time or at high pressure.

As described above, the composite ceramic superconducting wire can include a metallic matrix supporting a plurality of superconducting ceramic filaments extending along the length of the superconducting wire. Such a wire can be made by the well-known powder-in-tube process, which involves subjecting a container (e.g., a tube) filled with superconducting ceramic precursor powder to one or more repetitions of a mechanical deformation and heat treatment. Such processing steps can cause defects in the metallic matrix that give rise to cryogen infiltration. Preferably, the sealing structure is formed around the composite ceramic superconducting wire after the wire is made superconducting by the processing steps to avoid exposing the sealing structure to the harsh processing conditions.

Preferably, the metallic matrix is formed from a noble metal. A noble metal is a metal whose reaction products are thermodynamically unstable under the reaction conditions employed relative to the desired superconducting ceramic, or which does not react with the superconducting ceramic or its precursors under the conditions of manufacture of the composite. The noble metal may be a metal different from the metallic elements of the desired superconducting ceramic, such as silver, oxide dispersion strengthened (ODS) silver, a silver alloy or a silver/gold alloy, but it may also be a stoichiometric excess of one of the metallic elements of the desired superconducting ceramic, such as copper.

In another example, the composite ceramic superconducting wire is a multilayer structure including one or more layers of superconducting ceramic, one or more layers of buffer or protection layers, and one or more metal substrate layers supporting the other layers. The multilayer structure can be formed by well-known epitaxy techniques (e.g., sputtering, vacuum deposition, or molecular beam). Although the purpose of the buffer layers is to prevent chemical reactions between the superconducting ceramic and the external environment, such buffer layers are not generally sufficient to prevent cryogen infiltration, particularly when they are exposed to a fluid cryogen for a long time or at high pressure. The sealing structure is formed around the multilayer structure to prevent the cryogen infiltration.

As used herein, "thermal cycling" involves one or more repetitions of three phases in which the superconducting conductor or article is soaked in a coolant bath and returned to room temperature. The three phases are: i) a cooling phase in which the conductor or article is surrounded with coolant, and, optionally, pressure is increased or decreased; ii) a low temperature phase at constant pressure; and iii) a warming phase in which the coolant is removed and, if necessary, pressure is returned to ambient conditions.

Cryogen infiltration of the ceramic material can be determined by inspecting the superconducting conductor or article for balloons after thermal cycling. As used herein, a balloon is a local increase of the composite ceramic wire or tape volume due to internal structure expansion foLlowing thermal cycling. Typically, the volume increase corresponds to a local increase in thickness, e.g., an increase of a few percent to greater than 100% of the total thickness. For example, a balloon can increase the thickness by about 100%. The length of the balloon is a function of the amount cryogen penetration and longitudinal gas diffusion. Balloons have been observed to be about a few millimeters to a few centimeters long, and even longer.

Unless otherwise defined, all technical and scientific terms used herein have the same meaning as commonly understood by one of ordinary skill in the art to which the invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Embodiments of the invention can include many advantages. The sealing structure can prevent cryogen infiltration through surface defects or exposed ceramic surfaces that could otherwise form "balloons" and degrade the critical current carrying capacity of the superconducting wire during the thermal cycling necessary for its normal operation. Prevention of cryogen infiltration through defects in the superconducting composite ceramic wire is crucial to the longevity of the superconducting conductor or article. Formation of even one balloon can end the usefulness of the superconducting conductor or article, for example, because the balloon creates an even larger defect through which cryogen can infiltrate and produce additional balloons upon further thermal cycling. This in turn further reduces the critical current of the superconducting wire. Because of the sealing structure, the conductor can withstand thermal cycling, even in which the fluid cryogen is under pressurized conditions, without degrading the current carrying capability of the superconducting ceramic tape by more than 10% or even less. Prevention of such balloons also preserves the dimensional tolerances of the conductor.

The sealing structure can also prevent cryogen infiltration when the superconductive article is immersed in the fluid cryogen in a pressurized environment (e.g., greater than 1 bar to about 33 bar, such as about 10–15 bar) for long periods of time (e.g., several hours, several weeks, several years, or many years). Such conditions are typical for cabling applications. Moreover, the encapsulation of the composite ceramic superconducting tape provided by the sealing structure can be sufficiently rugged to allow the conductor to be bent or wound into coils or a helix. Furthermore, many embodiments of the superconducting conductor are formed by a continuous process, which allows the formation of long conductors (e.g., longer than about 50 m, and often longer than about several hundred meters).

Other features and advantages of the invention will be apparent from the following detailed description and from the claims.

BRIEF DESCRIPTION OF THE DRAWINGS

FIGS. 1a and 1b are cross sectional diagrams of a laminated superconducting ceramic conductor (FIG. 1a) and of an alternative embodiment of the ceramic composite tape (FIG. 1b) in the conductor of FIG. 1a;

DETAILED DESCRIPTION

Figure 1A:
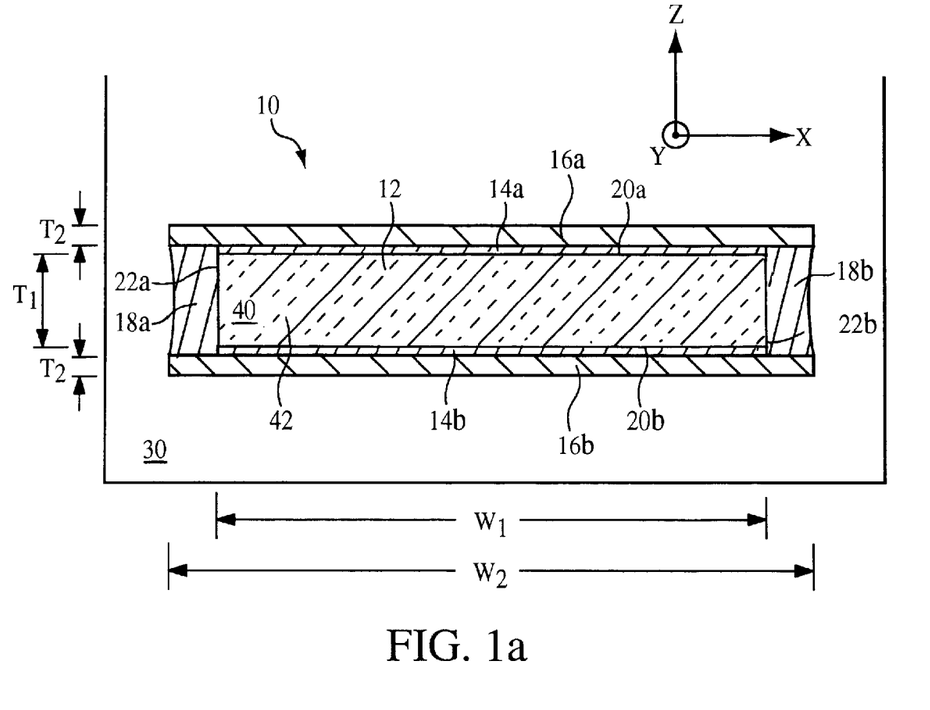

One embodiment of the invention is shown in FIG. 1a, which is a cross sectional view of a superconducting conductor 10 immersed in a fluid cryogen bath 30, which may be pressurized for an extended period of time. Conductor 10 includes a composite ceramic superconducting tape 12, solder layers 14a and 14b, metallic tapes 16a and 16b, and solder fillets 18a and 18b. Solder layers 14a and 14b bond metallic tapes 16a and 16b to the top and bottom surfaces 20a and 20b, respectively, of composite ceramic tape 12, to thereby seal the top and bottom surfaces 20a and 20b from the fluid cryogen 30. As illustrated, metallic tapes 16a and 16b are wider than composite ceramic tape 12 and overhang its sides 22a and 22b. Solder fillets 18a and 18b fill the spaces between the overhanging portions of the metallic tapes 16a and 16b to thereby seal the sides 22a and 22b of composite ceramic tape 12 from the fluid cryogen 30. The metallic tapes 16a and 16b provide mechanical support to the composite ceramic tape 12 and the combination of the metallic tapes 16a and 16band solder fillets 18a and 18b forms a sealing structure that totally encapsulates composite ceramic tape 12 along its length to substantially prevent cryogen 30 infiltration.

The composite ceramic tape 12 can include any superconducting ceramics, including superconducting copper oxides of the bismuth, rare earth, thallium, lead, or mercury families. Typical superconducting ceramic materials include, for example, $(Pb,Bi)_2Sr_2Ca_2Cu_3O$ (BSCCO 2223), $(Pb,Bi)_2Sr_1Ca_1Cu_2O$ (BSCCO 2112), $Y_1Ba_2Cu_3O_{7-\delta}$ (YBCO 123), and rare earth metal substitutions of Yttrium in YBCO. Composite ceramic tape 12 can be made using well-known processes such as powder-in-tube and coated conductor. For a description of such processes, see for example U.S. Pat. No. 5,801,124, "Laminated Superconducting Ceramic Composite Conductors", by Bruce R. Gamble, Gilbert N. Riley, Jr., John D. Scudiere, Michael D. Manlief, David M. Buzcek, and Gregory L Snitchler, issued Sep. 1, 1998, the contents of which are incorporated herein by reference.

Referring to FIG. 1a, composite ceramic tape 12 comprises a matrix 40 of noble metal surrounding and supporting a plurality of superconducting ceramic filaments 42 extending substantially along the length of conductor 10. A "noble metal" is a metal whose reaction products are thermodynamically unstable under the reaction conditions employed to prepare the ceramic tape. Thus, the noble metal matrix 40 does not react with the ceramic filaments 42 or its precursors during preparation of the composite ceramic tape 12. Suitable noble metals include, for example, silver, oxide dispersion strengthened (ODS) silver, a silver alloy, or a silver/gold alloy. Exemplary composite ceramic tapes including ODS silver can be formed in accordance with U.S. Ser. No. 08/731,302, "Improved Performance of Oxide Dispersion Strengthened Superconducting Composites" by Lawrence J. Masur et al., filed Oct. 15, 1996 and corresponding European Patent Application EP 0837512, published Apr. 22, 1998, the entire contents of both applications being incorporated herein by reference. The metallic tapes 16a and 16b can be, e.g., stainless steel, copper, copper alloy and super alloys. The solder 14a, 14b, 18a, and 18b is typically metallic, but can alternatively include wetted dispersions of metallic fibers or particles in an epoxy.

Suitable dimensions for one embodiment of the conductor 10 include: composite ceramic tape 12 thickness $T_1$ of about 0.008"; metallic tape 16a and 16b with a thickness $T_2$ of about 0.0015"; composite ceramic tape 12 with a width $W_1$ of about 0.160"; and metallic tape 16a and 16b with a width $W_2$ of about 0.190". Using this set of dimensions, the metallic tapes 16a and 16b overhang each side 22a and 22b of the composite ceramic tape 12 by about 0.015".

More generally, in other embodiments, $W_2$ can be at least 5% wider than $W_1$ and up to about 30% wider; preferably $W_2$ is about 15% to 25% wider than $W_1$. Also, composite ceramic tape 12 can have a width of about 0.02–1.0" or larger, and a thickness of about 0.001–0.040" or larger. Metallic tapes 16a and 16b typically have a thickness of about 0.001–0.003" or larger, although thinner ones may be used. Thick laminates, greater than about 0.004–0.02", preferably about 0.006", may advantageously be used in high field magnet applications. As indicated by the dimensions above, conductor 10 tends to be more wide than thick, with an aspect ratio typically greater than about 5, e.g., an aspect ratio of about 10. The solder thickness is typically in the range of about 0.0001" to about 0.001", and preferably 0.0002" and 0.0006". The conductor 10 is typically hundreds of meters long. The ends (not shown) of tape 12 can also be encapsulated, e.g., by solder or silicone. For example, a suitable silicone sealant is Dow Corning 732 multi-purpose sealant available from Dow Corning Corporation (Midland, Mich.).

Metallic tapes 16a and 16b are preferably selected to provide thermal and electrical conductivity, to permit cooling of the superconducting article, and to allow current transfer between the superconducting conductors in the article. The metallic tapes can also be selected based on their thermal stability properties. The laminates are preferably stainless steel tapes (other metal tapes, for example, copper, copper alloy or superalloy tapes can also be suitable). The metallic tapes are also preferably selected to have a coefficient of thermal expansion greater than that of the superconducting ceramic tape to impart compressive strain between metallic tapes 16a and 16b and composite ceramic tape 12 caused by cooling after lamination, which enhances the mechanical performance of the composite. Preferably, the metallic tape should also be selected to have a yield strength of at least 700 MPa.

Cryogen 30 can be any cryogen capable of maintaining superconductor 10 at or below its transition temperature. While not to be construed as limiting, liquid nitrogen is the particularly preferred cryogen, suitable for use in accordance with the invention. Depending on the application, cryogen 30 can also be pressurized. Refrigeration performed by liquid coolants is limited by the fluid critical point at the maximum achievable pressure. For example, for liquid nitrogen, a typical value for pressure is in the range of about 1 to 33 bar. Furthermore, in some embodiments, refrigeration can take place at subatmospheric pressures to affect the boiling temperature of the fluid cryogen.

The metallic tapes are laminated onto the composite tape after the composite tape has been formed, i.e., after the composite tape has been made superconducting. As a result, the sealing structure formed by the metallic tapes and solder fillets are not subject to harsh mechanical and thermal treatments used to form composite tape 12. Such treatments could degrade the hermetic sealing properties of the sealing structure.

Figure 2:
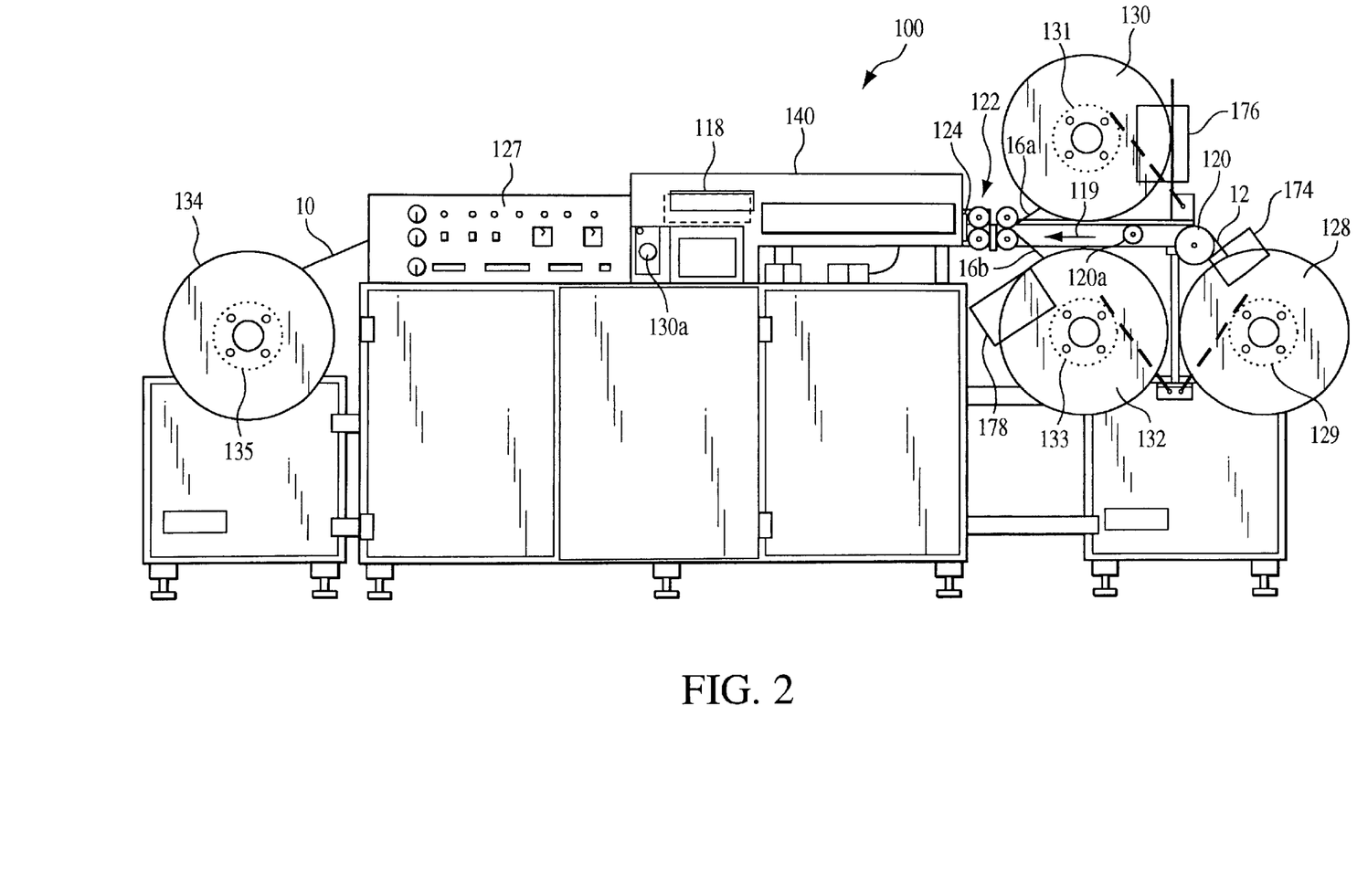
FIG. 2 is a schematic surface view of a laminating assembly in accordance with the invention.
Figure 3:
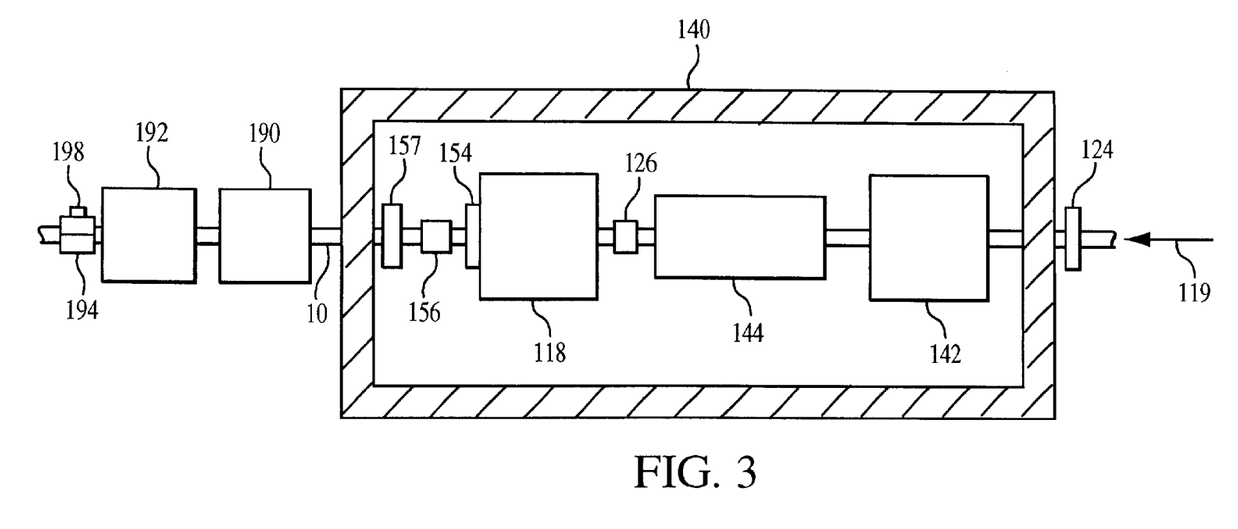
FIG. 3 is a top sectional view of an inert gas (e.g., nitrogen) enclosure of the laminating assembly of FIG. 2.

Referring to FIGS. 2 and 3, a laminator 100 forms conductor 10 by passing composite ceramic tape 12 and metallic tape 16a and 16b through a solder wave bath 118 and pressing them together in a die. Because metallic tapes 16a and 16b overhang the sides 22a and 22b of composite ceramic tape 12, capillary action adheres solder to the sides 22a and 22b of composite ceramic tape 12 to form solder fillets 18a and 18b.

Laminating assembly 100 includes cleaning devices 174, 176, and 178, laminator 118, for example, a solder wave or solder bath, and a series of feed guides 120, 120a, 122, 124, and 126 for guiding composite ceramic tape 12 and metallic tapes 16a and 16b into laminator 118. The cleaning devices 174, 176, and 178 may be, for example ultrasonic cleaning stations, flux stations, chemical deoxidation devices or mechanical scrubbers. Conductor tape 10 preferably travels along a substantially straight laminate process path (arrow 119) to prevent degradation of the superconductor tape 10 as it is fed through the feed guides 120, 120a, 122, 124, and 126, the cleaning devices 174, 176, and 178, and the laminator 118. Laminating assembly 100 also includes an instrument panel 127 for input of user commands and display of system status.

Composite ceramic tape 12, prior to lamination, is stored on a payoff roll 128. Metallic tapes 16a and 16b, prior to lamination, are stored on payoff rolls 130 and 132, respectively. A take-up roll 134 on which the resulting laminated superconductor tape 10 is taken-up is driven by a motor 135 and pulls composite ceramic tape 12 and metallic tapes 16a and 16b through the feed guides 120, 120a, 122, 124, and 126 and laminator 118. Payoff rolls 128, 130, and 132 preferably include brakes 129, 131, and 133, respectively, for independently controlling the tension in composite ceramic tape 12 and metallic tapes 16a and 16b. The radius of curvature of composite ceramic tape 12 as it is fed from payoff roll 128 is maintained at greater than about 8" to 10" inches to prevent mechanical, and hence electrical, degradation of the superconductor tape 10. Metallic tapes 16a and 16b can be tensioned during the laminating process, as taught, for example, in U.S. Ser. No. 08/705,811, entitled "Laminated Superconducting Ceramic Tape", by John D. Scudiere, David M. Buczek, Gregory L. Snitchler and Paul J. Di Pietro, filed Aug. 30, 1996, and the corresponding PCT International Publication No. WO 98/09295, the entire contents of both documents being incorporated herein by reference.

Laminating assembly 100 can include, for example, a nitrogen gas enclosure 140 housing laminator 118, a fluxer 142 located upstream of laminator 118, and a dryer/heater 144 located between fluxer 142 and laminator 118 to expand the composite ceramic tape 12 and the metallic tapes 16a and 16b. Preferably, the laminator 118 includes a solder wave and associated process settings (e.g., preheat temperature, pressure, and cooling rate) to minimize voids in the solder. Process parameters and equipment settings during the soldering process enable the formation of full fillets 18a and 18b on the edges 22a and 22b of composite ceramic tape 12 by capillary action. For example, device 130a controls the pressure on the wipe assembly.

Continuous fillets can be obtained by controlling the flux application and specific gravity (e.g., less than 1), the preheat temperature (e.g., greater than 100° C.), maintaining the alignment of the tapes in the wave, applying about 2 to 5 pounds of positive pressure on the conductor as it exits the wave, and rapidly and uniformly cooling the solder (e.g., less than about 0.5 sec). Typically line speeds can be up to about 10 m/min. Therefore, the superconducting conductors are manufactured in a continuous fashion, permitting the manufacture of conductors having a length of at least about 50 m, and typically much longer.

Solder fillets 18a and 18b hermetically seal sides 22a and 22b, respectively, of composite ceramic tape 12 because even if the solder fillets do not completely wet to sides 22a and 22b, they wet to the adjacent overhanging edges of metallic tapes 16a and 16b. As a result, each solder fillet forms a continuous surface between metallic tapes 16a and 16b, thereby hermetically sealing the sides of the composite ceramic tape. Moreover, because the solder fillets have relatively small dimensions (e.g., smaller than about 0.080") along the cross section of the conductor, shrinkage voids do not usually occur. See, e.g., *Principles of Soldering and Brazing*, eds. Humpston and Jacobson, Chapter 4, section 4.4.1.2, pg. 127 (ASM International 1996). Thus, the solder fillets are non-porous and prevent cryogen infiltration into the sides the composite ceramic tape.

A guide dam 154 is used to control the thickness of the solder layers 14a and 14b between metallic tapes 16a and 16b and composite ceramic tape 12. A cooler 156 blows air at, for example, less than 100° C., to remove excess solder from laminated conductor tape 10 and cools the laminated conductor tape 10 to freeze the solder layers 14a and 14b and solder fillets 18a and 18b. An additional feed guide 157 is located downstream of cooler 156.

Located downstream of cooler 156 and feed guide 157 are a clean station 190 which sprays a cleaning fluid, for example, distilled water at about 70° C., over conductor 10, and a dryer 192 located downstream of clean station 190 including air jets at about 100° C. Guide rollers 194 and 198 are located downstream of dryer 192.

Surfaces 20a, 20b, 22a and 22b of composite ceramic tape 12 are vulnerable surfaces that can have porous defects subject to cryogenic infiltration. Preferably, metallic tapes 16a and 16b are cleaned by the same process and to the same degree. Then, tape 12 and metallic tapes 16a and 16b are heated to a soldering temperature. The solder flux may be applied by a flux soak, spray or dip, a flux wipe, or a bubbler to insure that the vulnerable surface is continuously covered with flux. Fluxes which do not have adverse chemical reactions with the superconducting ceramic or the matrix, which are cleaned in water and which provide maximum wetability of the tape and laminate are preferred. For example, fluxes 856, 857 and 260HF from Alpha Metals (Jersey City, N.J.) may be used. Preferred solders include Pb—Sn—Ag, Pb—Sn, Sn—Ag, and In—Pb. Preferably, solders should have thermal and mechanical (e.g., tensile strength, coefficient of thermal expansion (CTE), and elongation at both room temperature and cryogenic operating temperature) compatible with those of the laminated structure.

Tension on composite ceramic tape 12 is preferably maintained at relatively low levels during lamination, preferably corresponding to a strain of about 0.01% or less, to prevent tape degradation. The independently controlled brakes 129, 131, and 133 permit the metallic tapes 16a and 16b to be tensioned at a higher tension than composite ceramic tape 12 if desired during the lamination process. As the laminated conductor tape 10 is cooled, the composite ceramic tape 12 and metallic tapes 16a and 16b retract as they start to cool and the solder in solder layers 14a and 14b and fillets 18a and 18b freezes, sealing the composite ceramic tape 12 to the metallic tapes 16a and 16b.

Figure 1B:
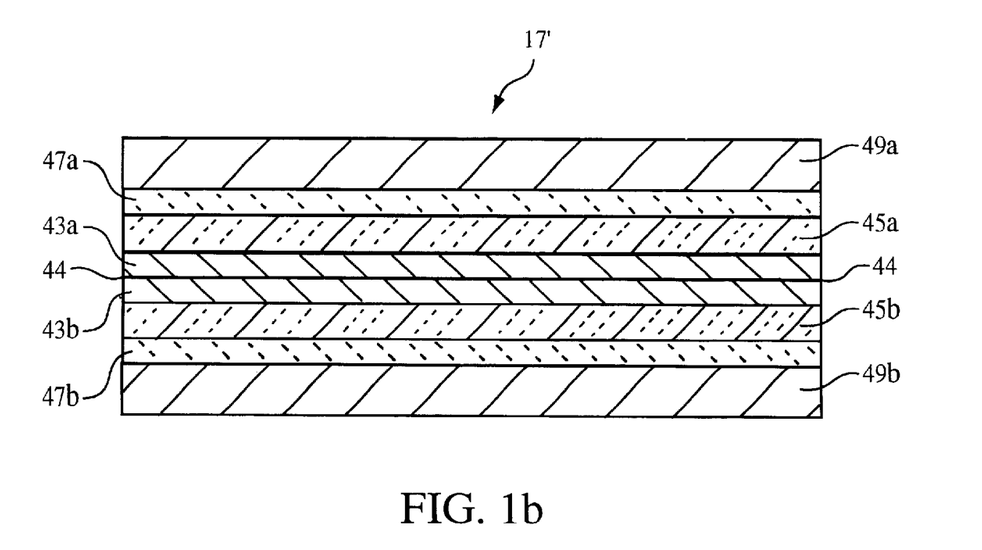

In other embodiments, the composite ceramic tape 12 in conductor 10, which includes superconducting ceramic filaments 42 in a metallic matrix 40, can be replaced with a composite ceramic tape in a coated conductor configuration, as exemplified by composite ceramic tape 12' shown in FIG. 1b. Tape 12' includes a pair of superconducting layers 45a and 45b (e.g., YBCO (YBCO 123), rare earth metal substitutions of Yttrium in YBCO, BSSCO, or thallium-based superconductors), wherein layers 45a and 45b each include a cap layer 43a and 43b, respectively. Cap layers 43a and 43b are soldered, glued, or otherwise bonded to one another (e.g., by diffusion bonded) as represented by reference numeral 44. Tape 12' further includes buffer layers 47a and 47b sandwiching superconducting layers 45a and 45b, and substrate layers 49a and 49b supporting the buffered superconducting layers. A suitable cap layer can be made from, for example, a conductive metal, e.g., silver, copper, aluminum, or combinations or alloys thereof. Suitable buffer layers include, e.g., $CeO_2$, YSZ (yttria stabilized zirconia), $SrTiO_3$, and $Y_2O_3$. Suitable substrate layers can include, for example, a non-ferromagnetic layer such as nickel/copper alloys. Substrate layers are described in, for example, U.S. Ser. No. 08/943,047 "Substrate with Improved Oxidation Resistance" by Cornelis Leo Hans Thieme, Elliot D. Thompson, Leslie G. Fritzemeier, Robert D. Cameron, and Edward J. Siegal, filed Oct. 1, 1997, and corresponding PCT International Publication No. WO 99/17307 published Apr. 8, 1999, the entire contents of both being incorporated herein by reference. As described above, tape 12' can replace tape 12 in FIG. 1a, with the structure hermetically sealing composite ceramic tape 12' (i.e., the metallic tapes and solder fillets) and its formation being the same as that described with reference to FIG. 1a.

Alternatively, tape 12' can be modified to be effective against cryogen infiltration. For example, substrates 49a and 49b are used similarly to the laminated metallic tapes 16a and 16b shown in FIG. 1a and sides 22a and 22b are sealed from the environment as described herein (e.g., by solder or welding).

Figure 4:
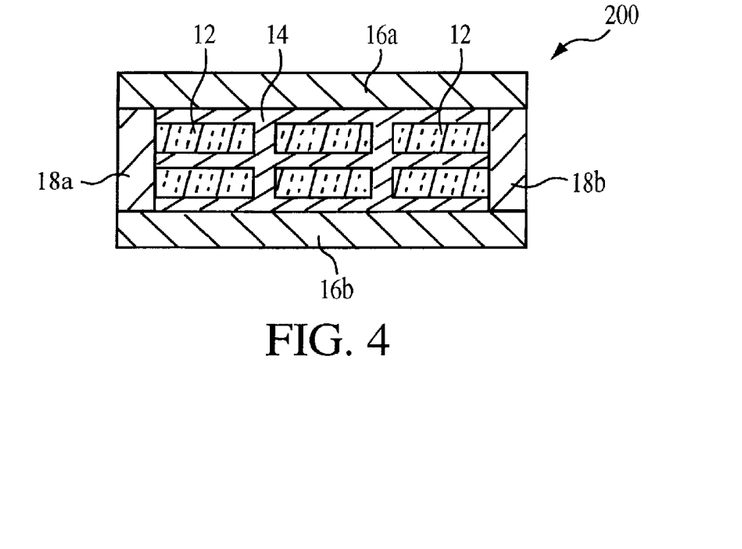
FIG. 4 is a cross section of an additional embodiment of a superconducting ceramic conductor.

Referring to FIG. 4, multiple stacks of the superconducting composite ceramic tapes (e.g., stacks of tape 12, or stacks of tape 12') can be laminated between metallic tapes 16a and 16b by solder 14 to form configuration 200. As in the embodiment of FIG. 1, solder fillets 18a and 18b seal the sides of the tapes 12 and form because the edges of metallic tapes 16a and 16b overhang the sides of tapes 12 that would otherwise be exposed to cryogen infiltration.

Figure 8A:
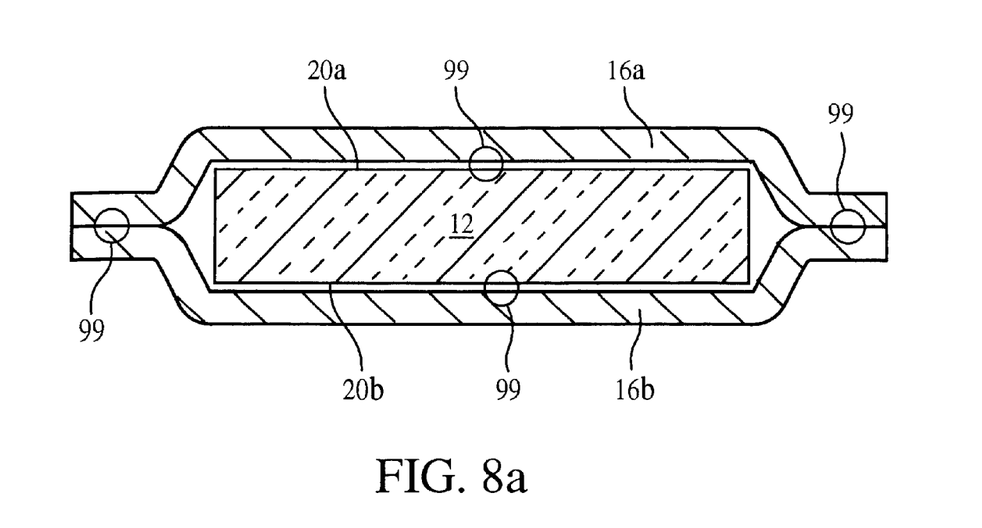
FIGS. 8a and 8b are schematic cross sections of embodiments of a superconducting ceramic conductor in which metallic tape laminates are welded to one another to seal the composite ceramic tape.
Figure 8B:
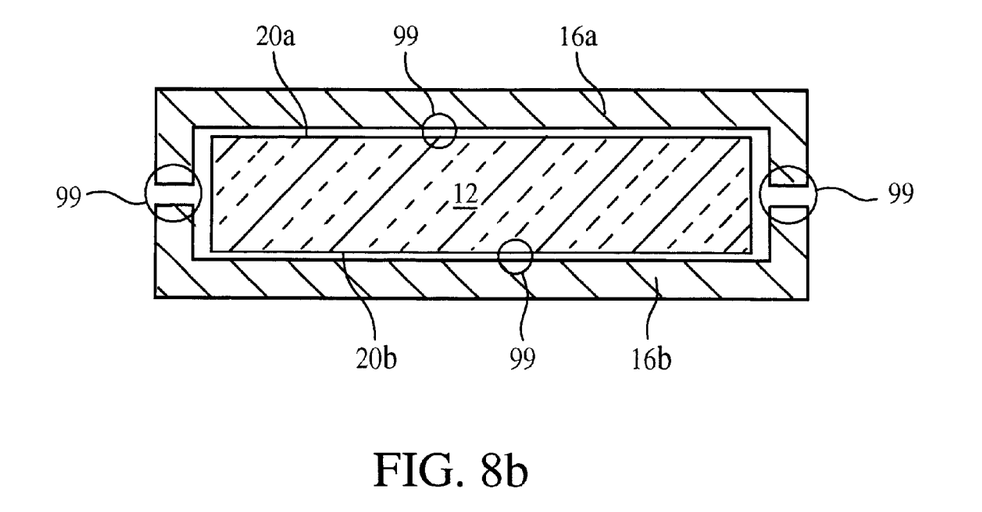

In other embodiments, metallic tapes 16a and 16b can be welded, rather than soldered, to the top and bottom surfaces 20a and 20b of the composite ceramic tape 12 and to each other at welding joints 99, as shown for example in FIGS. 8a and 8b. The welded metallic tapes 16a and 16b completely cover and thereby hermetically seal the top, bottom and side surfaces of the composite ceramic tape 12 from the fluid cryogen 30.

Figure 5A:
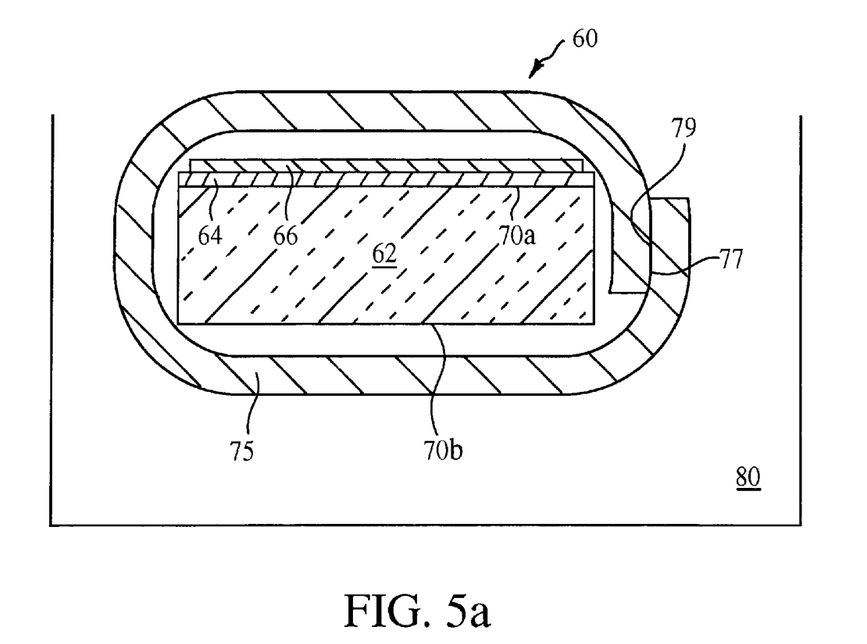
FIGS. 5a, 5b, and 5c are cross sections of embodiments of a superconducting ceramic conductor in which a ductile sheet is wrapped around the ceramic tape to prevent cryogen infiltration.

In further embodiments, the sealing structure can include one or more sheets of non-porous ductile material, e.g., sheets of copper, that are wrapped around the composite ceramic tape and welded to one another to hermetically seal the top, bottom, and sides of the composite ceramic tape from the fluid cryogen. Referring to FIG. 5a, for example, a cross section of conductor 60 is shown. Conductor 60 includes a superconducting composite ceramic tape 62 having a metallic tape 66 laminated to top surface 70a by solder layer 64. Composite ceramic tape 62 and laminated metallic tape 66 are similar to those described above. Metallic tape 66 imparts mechanical strength to composite ceramic tape 62. A sheet 75 of ductile material forms a sealing structure that encircles the top, bottom, and sides of tape 62 and metallic tape 66 and extends along their length. Portions 77 and 79 on opposite faces of sheet 75 are welded to one to hermetically seal the composite ceramic tape from cryogen bath 80.

Figure 5B:
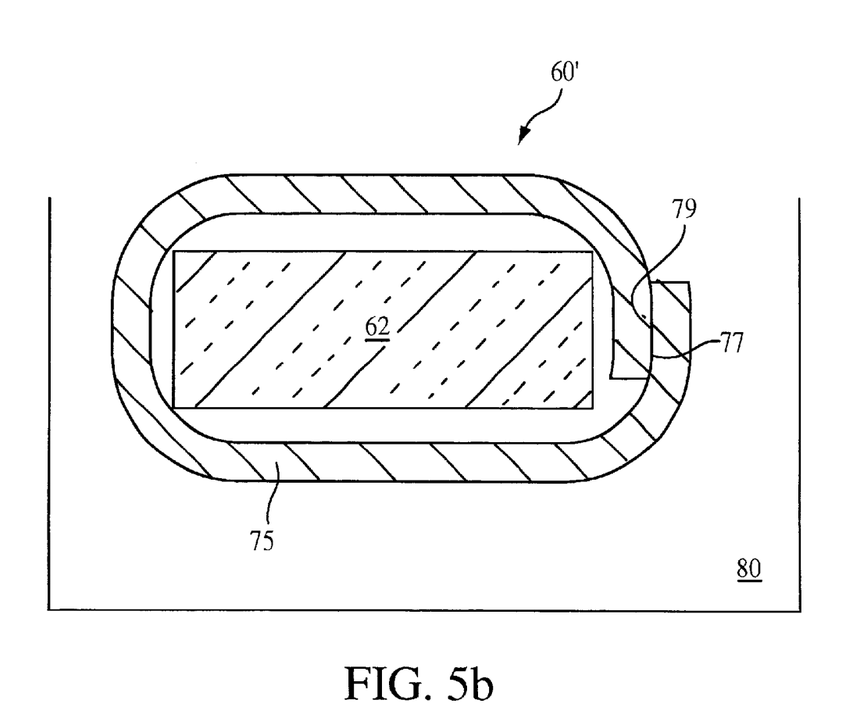
Figure 5C:
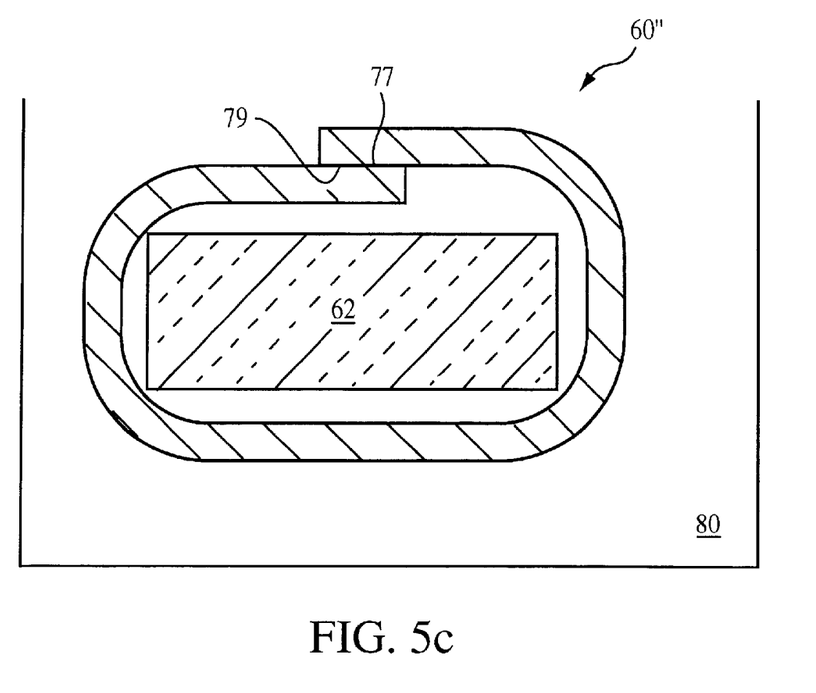

In other embodiments, multiple sheets of ductile material can be welded to one another to encircle the top bottom and sides of the laminated ceramic and metallic tapes. Furthermore, in other embodiments a second metallic tape can be laminated to the bottom side 70b of composite ceramic tape 62 to impart additional mechanical strength. Alternatively, in other embodiments, the sealing structure formed by sheet 75 imparts sufficient mechanical strength to obviate the need for any laminated metallic tape, as shown, for example, by the cross section of conductor 601 in FIG. 5b. Furthermore, rather than weld portions 77 and 79 of sheet 75 to one another on the side of composite ceramic tape 62, as in FIGS. 5a and 5b, portions 77 and 79 can be welded to one another on the top of composite ceramic tape 62 as shown for conductor 60" in FIG. 5c.

In preferred embodiments, the ductile sheet is conductive so that when multiple conductors 60 are stacked on top of one another there are current pathways between adjacent conductors. Suitable materials for the ductile sheet are copper, copper alloys, stainless steel and superalloys. Suitable thicknesses for the ductile sheet are comparable to those described above for the metallic tapes. The sheet can be wrapped around the composite ceramic tape or laminated structure by roll forming. See, e.g., *Handbook of Metal Forming Processes,* eds., Betzalel and Avitzur (Wiley Publishing, 1983), section 9.2.1, pg. 459.

Figure 6:
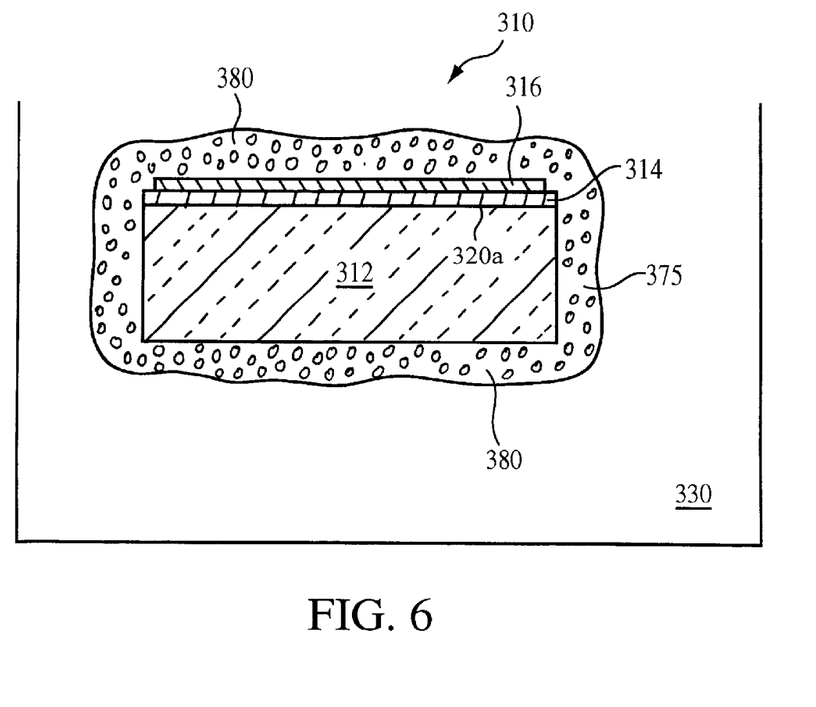
FIG. 6 is a cross section of an embodiment of a superconducting ceramic conductor in which a conductive polymer layer seals the ceramic tape to prevent cryogen infiltration.

In further embodiments, the sealing structure can be a curable polymer material, e.g., an acrylate polymer, which is applied to the top, bottom, and sides of a composite ceramic tape or laminated ceramic and metallic tapes and cured to hermetically seal the conductor from the fluid cryogen. For example, referring to FIG. 6, a conductor 310 includes a superconducting composite ceramic tape 312 having a metallic tape 316 laminated to top surface 320a by solder layer 314. Composite ceramic tape 312 and laminated metallic tape 316 are similar to those described above, with metallic tape 316 imparting mechanical strength to composite ceramic tape 312. Cured polymer layer 375 surrounds the top, bottom, and sides of laminated tapes 312 and 316 and extends along their length to hermetically seal the conductor from fluid cryogen 330. The polymer layer can be applied to the laminated ceramic and metallic tapes by coating or dipping and can then be cured thermally or by exposure to UV radiation. Suitable curable polymers include Desolite 2002-17 from Desotech (Elgin, Ill.), which is a UV curable acrylate polymer. This family of polymers has superior mechanical properties at cryogenic temperatures. For example, at 77 K, the ultimate tensile strength (UTS) is about 100–160 MPa and the elongation is about 0.3% to 0.5%.

Figure 7:
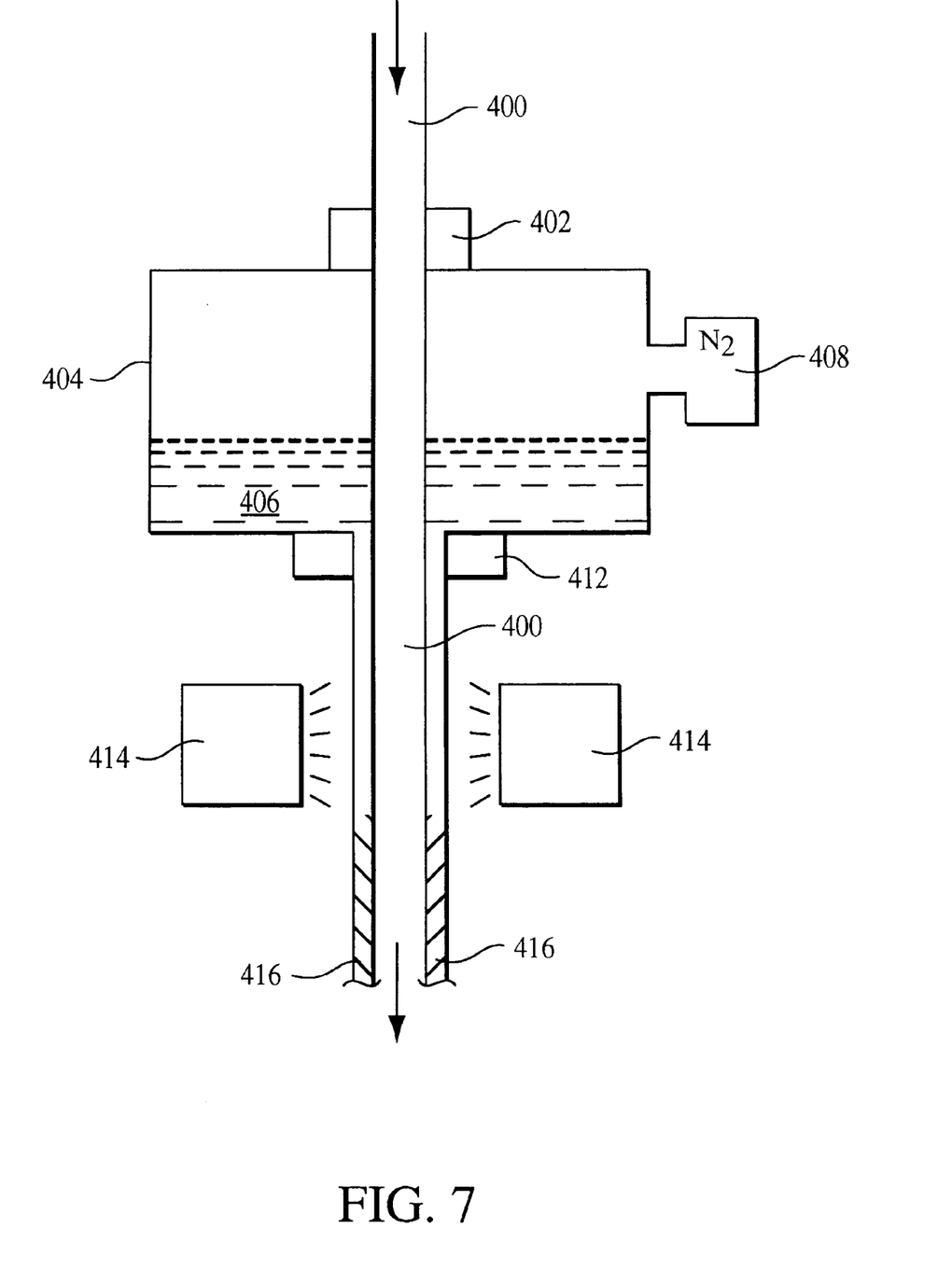
FIG. 7 is a schematic diagram of an apparatus for forming the polymer layer in the superconducting ceramic conductor of FIG. 6.

Preferably, the polymer layer would be applied to laminated tapes 312 and 316 in an in-line fashion immediately following lamination. For example, referring to FIG. 7, the laminated tapes 400 are drawn through a die 402 into a bath 404 containing uncured polymer 406 under a nitrogen purge 408. Polymer 406 coats tape 400, which is then drawn through a second die 412. The coated tape is then exposed to ultraviolet light from UV source 414 to cure the polymer and form polymer layer 416.

Referring again to FIG. 6, in preferred embodiments, conductive media 380 such as copper, silver, gold, or aluminum particles (having, e.g., diameters of about 10–20 microns) are dispersed within polymer layer 375 so that the cured polymer-sealed conductor is also conductive along at least its thickness (i.e., along the z-axis). Conductivity along the thickness provides an alternative current path in applications such as power cabling in which many superconducting ceramic conductors are stacked on top of one another and where current transfer between layers may be important.

In such applications, the conductive media is added to and dispersed within the polymer prior to coating the laminated tapes. The amount of conductive media within the polymer is sufficient to impart the desired conductivity along the z-axis. The conductive media can also include metallic rods or screens. For example, the polymer coating could encapsulate a conductive wire mesh.

Figure 9:
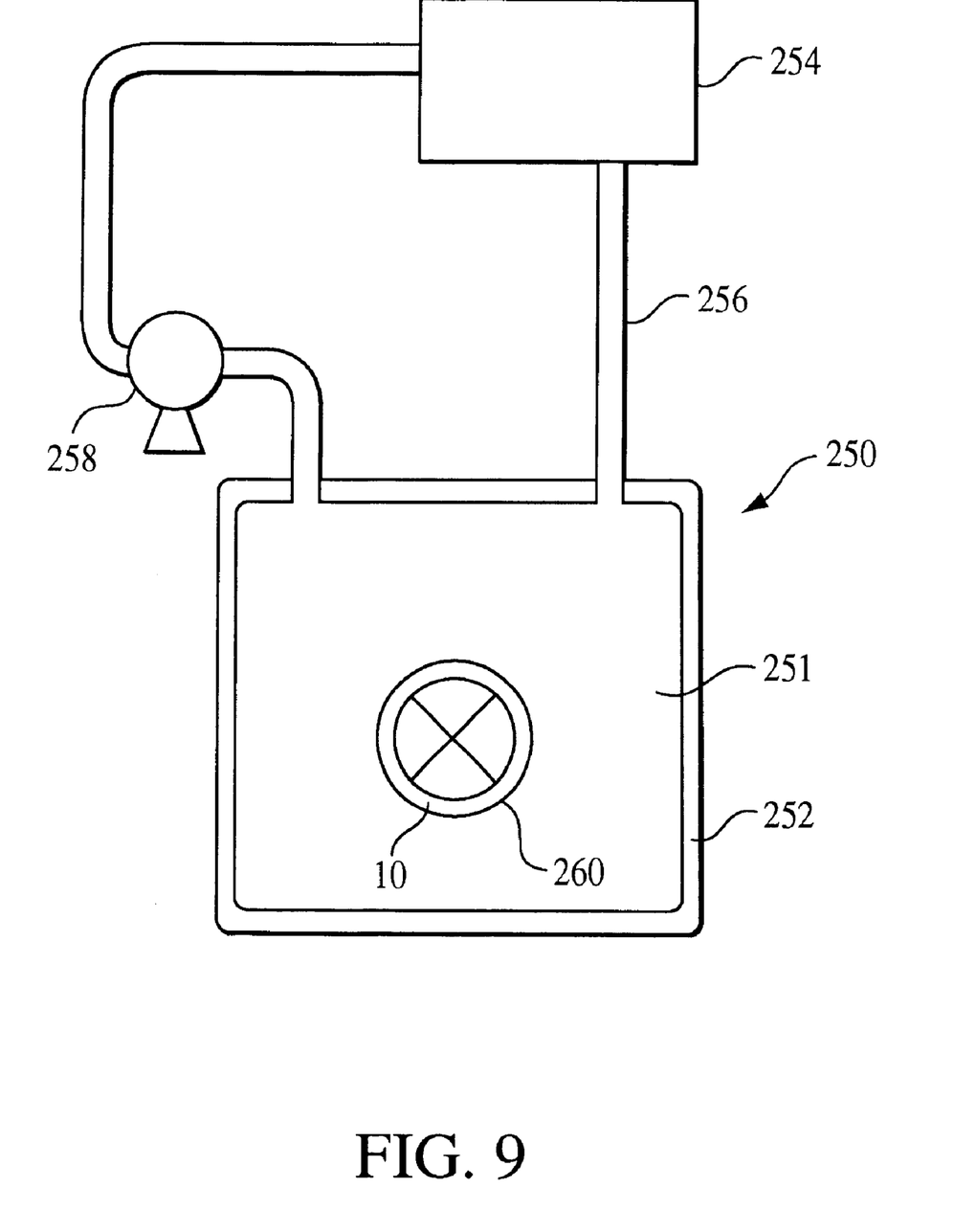
FIG. 9 is a schematic cross section of a fluid cryogen cooled assembly including a superconducting article in accordance with one embodiment of the invention.

FIG. 9 shows a system 250 including a superconducting article 260 such as a cable utilizing a conductor 10 made in accordance with the invention. The embodiment illustrated in FIG. 9 allows cryogen 251 to act as a heat transfer medium in system 250. In particular, cryogen 251 is contained in vessel 252 which also contains a superconducting article 260 comprising conductor 10, which may be, for example, a superconducting cable viewed in cross section or a superconducting magnet coil. Superconducting article 260 is at least partially immersed in the fluid cryogen 251 with the conductor 10 in direct contact with the fluid cryogen 251. The temperature of cryogen 251 is maintained within a desired range, e.g., liquid nitrogen temperatures, by circulating cryogen 251 through refrigeration unit 254 and circulating pump 258 in line 256. While not to be construed as limiting, the fluid cryogen 251 could be, for example, liquid nitrogen, liquid helium, liquid hydrogen, or supercritical helium. The temperature of the fluid cryogen 251 in line 256 is maintained by. refrigeration unit 254. The amount of material in article 260 determines the load on the unit 254, and thus the operating cost of the assembly 250.

By using the sealing structures described above for protection against cryogen 251 infiltration of the composite ceramic tape 12, the thickness of the matrix material 40 in the composite ceramic tape 12 can typically be substantially reduced or the fill factor of the superconducting tape can be increased. Absent the sealing structure as provided by the present invention, increasing the fill factor reduces the external thickness of the composite material and thereby increases the likelihood of surface defects that give rise to balloons. Moreover, obtaining larger fill factors typically requires more severe manufacturing conditions that also increase the likelihood of surface defects that could give rise to balloons absent the sealing structure. Thus the sealing structure permits an increase in fill factor and a corresponding increase in critical current density without increasing the likelihood of balloon formation. This is a particularly significant advantage for long length cables because it reduces the number of tapes needed for a cable and also reduces operating costs. It can also a significant consideration for any application in which the superconducting article is placed in a pool-boiling fluid cryogen environment where the article is directly cooled by the fluid cryogen.

Typical operation conditions for the superconducting article 260 include temperatures of 66 to 80 K, and, for pressurized environments, pressures of about 1 to 33 atm, e.g., about 10–15 atm. Circulating pump 258 can be used to create such pressures. In some applications, article 260 can be exposed to such conditions for many years. However, article 260 must also withstand thermal cycling in which the article is returned to ambient conditions for, e.g., normal servicing. The sealing structures described above minimize degradation of the superconducting article caused by cryogen infiltration despite such operating conditions and thermal cycling.

The invention may be further understood from the following non-limiting examples.

EXAMPLE 1

A BSSCO multifilament composite ceramic tape was laminated using overhanging stainless steel metallic tapes as described above. The metallic tapes were 0.154" wide and the composite ceramic tape was 0.124" wide. Solder fillets were approximately 0.015" (along the width or x-direction) on each side of the composite ceramic tape. The lamination process used to insure continuous fillets included a preheat temperature prior to soldering in excess of 100° C., positive pressure (5–10 MPa) on the laminated tapes as they exit the solder pot, and rapid solidification with air knifes. The ends of the conductor were separately sealed using a silicon, in particular, Dow Corning 732 multi-purpose sealant available from Dow Corning Corporation (Midland, Mich.). Sample conductors were soaked in liquid nitrogen for up to six weeks at ambient pressure. After being returned to ambient conditions, no balloons were apparent. In another test sequence, sample conductors were aged at 125° C. for up to 72 hours and then soaked in liquid nitrogen at 10 atm for up to 36 hours. After being returned to ambient conditions, no balloons were apparent. Wire lengths for both test sequences were about 5–15 meters.

EXAMPLE 2

BSSCO multifilament composite ceramic tapes were laminated with stainless steel metallic tapes on their top and bottom faces. The composite ceramic tapes were approximately 0.160" wide and the metallic tapes were approximately 0.154" wide, so that the metallic tapes did not overhang the composite tape. The laminated tapes were then coated with an acrylate coating and UV cured. Sample conductors were then thermally cycled ten times from 77 K to room temperature over eight hours, and then soaked in liquid nitrogen for two weeks under ambient pressure. After being returned to ambient conditions, no balloons were apparent. In a second test, sample conductors were thermally cycled ten times from 77 K to room temperature and then soaked in liquid nitrogen for 36 hours at 10 atm. After being returned to ambient conditions, no balloons were apparent.

EXAMPLE 3

A first set of BSSCO multifilament composite ceramic tapes were laminated with stainless steel metallic tapes on their top and bottom faces using a solder lamination process without overhanging metallic tapes. The stainless steel tapes were about 0.153" wide and covered about 95% of the top and bottom surfaces of the composite ceramic tapes, which were about 0.161" wide.

A second set of BSSCO multifilament composite ceramic tapes were also laminated with overhanging stainless steel metallic tapes on their top and bottom faces using the solder lamination process described above and in Example 1. In the second set, the stainless steel tapes were about 0.197" wide, which was wider than the composite ceramic tapes, which were about 0.153" wide.

Both sets of samples were soaked in liquid nitrogen at 30 atm for 16 hours after their ends were sealed with separate solder caps. Upon removing the samples from the liquid nitrogen bath, all of the samples from the first set had balloon formation, whereas none of the samples from the second set had balloon formation.

EXAMPLE 4

Two sets of BSSCO multifilament conductors were manufactured as in Example 3. The samples were mechanically aged by applying a unidirectional pressure over the conductor surface to simulate the cryostat effect present in a power transmission cable application. After the mechanical aging, the samples were soaked in liquid nitrogen at 5 bar for 8 hours. Upon removing the samples from the liquid nitrogen bath, all of the samples from the first set had balloon formation, whereas none of the samples from the second set had balloon formation.

EXAMPLE 5

Two sets of BSSCO multifilament conductors were manufactured as in Example 3. The samples were mechanically aged by applying bending, tensile and torsion deformations to simulate the deformation applied during the manufacturing phase of a power transmission application (e.g., a cable transformer). No degradation of the conductors' critical current density was observed following the mechanical aging. After the mechanical aging, the samples were soaked in liquid nitrogen at 30 bar for 16 hours. Upon removing the samples from the liquid nitrogen bath, all of the samples from the first set had balloon formation, whereas none of the samples from the second set had balloon formation.

EXAMPLE 6

Two sets of BSSCO multifilament conductors were manufactured as in Example 3 and mechanically aged as in Example 5. The samples were then further mechanically aged by winding them on an aluminum cylindrical mandrel having a coefficient of thermal expansion greater than that of the conductors and heating them to more than 100° C. for about 100 hours. The wound conductors were then fast cycled (i.e., until the bath reaches equilibrium) tens times between a liquid nitrogen bath at 1 atm and room temperature. The conductors were then placed in a liquid nitrogen bath at 30 bar for 16 hours. Upon removing the samples from the liquid nitrogen bath, all of the samples from the first set had balloon formation, whereas none of the samples from the second set had balloon formation. Similar results were obtained when the order of the mechanical and thermal aging processes were reversed.

Other aspects, advantages, and modifications are within the scope of the following claims. For example, although the detailed description above referred to composite ceramic superconducting tapes, which have substantially rectangular cross sections, more generally, the sealing structure can hermetically seal composite ceramic superconducting wires (such as tapes or rods) having arbitrary cross sections, e.g., circular, elliptical, or rectangular cross sections.

What is claimed is:

1. A superconducting ceramic conductor comprising:
   a composite ceramic superconducting tape having an outer surface along its length, the tape having a top face, a bottom face, and side faces defining the outer surface; and
   a sealing structure hermetically surrounding the outer surface to prevent a cryogen from infiltrating into the wire and degrading its superconducting properties, wherein the sealing structure comprises a first metallic tape laminated to the top face of the composite tape, a second metallic tape laminated to the bottom face of the composite tape, the first and second metallic tapes extending beyond the side faces of the composite tape, and non-porous solder filler adjacent the side faces of the composite tape filling space between the metallic tapes.

2. The conductor claim 1, wherein the tape and surrounding sealing structure are greater than 50 meters long.

3. The conductor of claim 1, wherein the tape comprises a metallic matrix supporting a plurality of superconducting ceramic filaments.

4. The conductor of claim 1, wherein the tape comprises at least one superconducting ceramic layer and at least one metallic substrate supporting the at least one superconducting ceramic layer.

5. The conductor of claim 1, wherein the sealing structure prevents the cryogen from infiltrating into the tape through the outer surface under pressurized conditions.

6. The conductor of claim 1, wherein the sealing structure prevents a liquid nitrogen cryogen from infiltrating into the tape through the outer surface under pressurized conditions that exceed about 10 atm.

7. The conductor of claim 1, wherein the metallic tapes comprise stainless steel, Cu—Be alloy, aluminum, copper, nickel, or Cu—Ni alloy.

8. The conductor of claim 1, wherein the first and second metallic tapes are at least 5% wider than the composite tape.

9. The conductor of claim 1, wherein the conductor has an aspect ratio greater than about five.

10. A superconducting ceramic conductor comprising:
    a composite ceramic superconducting tape having an outer surface along its length, the tape having a top face, a bottom face, and side faces defining the outer surface; and
    a sealing structure hermetically surrounding the outer surface to prevent a cryogen from infiltrating into the wire and degrading its superconducting properties,
    wherein the sealing structure comprises:
    a first metallic tape laminated to the top face of the composite tape and having portions extending beyond the side faces of the composite tape; and
    a second metallic tape laminated to the bottom face of the composite tape and having portions extending beyond the side faces of the composite tape, wherein adjacent each side face the extended portion of the first metallic tape is welded to the extended portion of the second metallic tape.

11. A superconducting coil, comprising a superconducting ceramic conductor according to claim 1.

12. A superconducting cable, comprising a superconducting ceramic conductor according to claim 1.

13. The conductor claim 10, wherein the tape and surrounding sealing structure are greater than 50 meter long.

14. The conductor of claim 10, wherein the tape comprises a metallic matrix supporting a plurality of superconducting ceramic filaments.

15. The conductor of claim 10, wherein the tape comprises at least one superconducting ceramic layer and at least one metallic substrate supporting the at least one superconducting ceramic layer.

16. The conductor of claim 10, wherein the sealing structure prevents the cryogen from infiltrating into the tape through the outer surface under pressurized conditions.

17. The conductor of claim 10, wherein the sealing structure prevents a liquid nitrogen cryogen from infiltrating into the tape through the outer surface under pressurized conditions that exceed about 10 atm.

18. A superconducting cable, comprising a superconducting ceramic conductor according to claim 10.

19. A superconducting coil, comprising a superconducting ceramic conductor according to claim 10.

20. A superconducting ceramic conductor comprising:
    a composite ceramic superconducting wire having an outer surface along its length; and
    a sealing structure hermetically surrounding the outer surface to prevent a cryogen from infiltrating into the wire and degrading its superconducting properties, wherein the sealing structure comprises a ductile metallic sheet encircling the outer surface of the were, wherein regions on opposite sides of the metallic sheet are welded to one another.

21. The conductor of claim 20 further comprising a metallic tape laminated to the wire, the ductile metallic sheet encircling the wire and the metallic tape.

22. The conductor claim 20, wherein the wire and surrounding sealing structure are greater than 50 meters long.

23. The conductor of claim 20, wherein the wire comprises a metallic matrix supporting a plurality of superconducting ceramic filaments.

24. The conductor of claim 20, wherein the wire comprises at least one superconducting ceramic layer and at least one metallic substrate supporting the at least one superconducting ceramic layer.

25. The conductor of claim 20, wherein the sealing structure prevents the cryogen from infiltrating into the wire through the outer surface under pressurized conditions.

26. The conductor of claim 20, wherein the sealing structure prevents a liquid nitrogen cryogen form infiltrating into the wire through the outer surface under pressurized conditions that exceed about 10 atm.

27. A superconducting cable, comprising a superconducting ceramic conductor according to claim 20.

28. A superconducting coil, comprising a superconducting ceramic conductor according to claim 20.

* * * * *

UNITED STATES PATENT AND TRADEMARK OFFICE
CERTIFICATE OF CORRECTION

PATENT NO. : 6,444,917 B1
DATED : September 3, 2002
INVENTOR(S) : Marco Nassi et al.

It is certified that error appears in the above-identified patent and that said Letters Patent is hereby corrected as shown below:

<u>Title page,</u>
Item [56], References Cited, U.S. PATENT DOCUMENTS, replace
"3,537,837 A    11/1970    Benz et al." with -- 3,537,837 A    6/1967    Benz et al. --

Signed and Sealed this

Twenty-second Day of June, 2004

JON W. DUDAS
*Acting Director of the United States Patent and Trademark Office*